(12) United States Patent
Chang et al.

(10) Patent No.: US 8,592,032 B2
(45) Date of Patent: Nov. 26, 2013

(54) COATED ARTICLE AND METHOD FOR MAKING THE SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Nan Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 147 days.

(21) Appl. No.: 13/169,729

(22) Filed: Jun. 27, 2011

(65) Prior Publication Data

US 2012/0164460 A1    Jun. 28, 2012

(30) Foreign Application Priority Data

Dec. 23, 2010   (CN) .......................... 2010 1 0602256

(51) Int. Cl.
*B32B 9/00*    (2006.01)

(52) U.S. Cl.
USPC ............ 428/336; 428/697; 428/698; 428/699

(58) Field of Classification Search
USPC ................... 428/336, 697, 698, 699
See application file for complete search history.

(56) References Cited

U.S. PATENT DOCUMENTS 6,586,122 B2 *   7/2003   Ishikawa et al. ............. 428/698
7,758,974 B2 *   7/2010   Yamamoto et al. .......... 428/697

FOREIGN PATENT DOCUMENTS

| JP | 2002-266697 | * | 9/2002 |
| JP | 2003-025113 | * | 1/2003 |
| JP | 2005-186184 | * | 7/2005 |

* cited by examiner

*Primary Examiner* — Archene Turner
(74) *Attorney, Agent, or Firm* — Altis Law Group, Inc.

(57) ABSTRACT

A coated article is described. The coated article includes an aluminum or aluminum alloy substrate and a corrosion resistant layer formed on the substrate. The corrosion resistant layer is a compound silicon-chromium-nitrogen layer. A method for making the coated article is also described.

4 Claims, 2 Drawing Sheets

COATED ARTICLE AND METHOD FOR MAKING THE SAME

CROSS-REFERENCE TO RELATED APPLICATIONS

This application is one of the two related co-pending U.S. patent applications listed below. All listed applications have the same assignee. The disclosure of each of the listed applications is incorporated by reference into another listed application.

| | Title | Inventors |
|---|---|---|
| 13/169,725 | COATED ARTICLE AND METHOD FOR MAKING THE SAME | HSIN-PEI CHANG et al. |
| 13/169,729 | COATED ARTICLE AND METHOD FOR MAKING THE SAME | HSIN-PEI CHANG et al. |

BACKGROUND

1. Technical Field

The present disclosure relates to coated articles, particularly to a coated article having a corrosion resistance property and a method for making the coated article.

2. Description of Related Art

Aluminum or aluminum alloy is widely used for its excellent properties. To protect the aluminum or aluminum alloy from corrosion, protective layers may be formed on the aluminum or aluminum alloy by anodizing, painting, or vacuum depositing. However, the anodizing and painting processes are not environmentally friendly, and protective layers formed by vacuum depositing have pinholes and cracks formed therein. These pinholes and cracks allow corrosives to permeate the layers causing a galvanic corrosion to the layers and the underlying aluminum or aluminum alloy.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
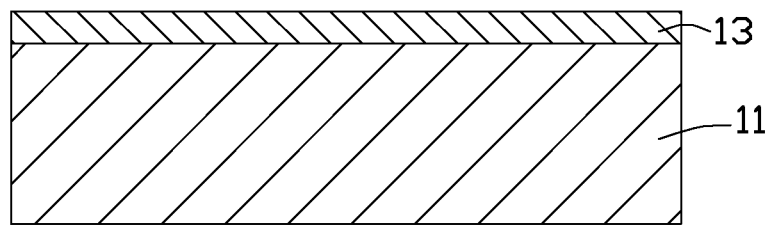
FIG. 1 is a cross-sectional view of an exemplary embodiment of a coated article.

FIG. 1 shows a coated article 10 according to an exemplary embodiment. The coated article 10 includes an aluminum or aluminum alloy substrate 11, and a corrosion resistant layer 13 formed on a surface of the substrate 11.

The corrosion resistant layer 13 is a compound silicon-chromium-nitrogen (SiCrN) layer formed by vacuum sputtering. The chromium within the SiCrN may have an atomic percentage of about 35%-40%. The silicon within the SiCrN may have an atomic percentage of about 20%-40%. The nitrogen within the SiCrN may have an atomic percentage of about 20%-40%. The corrosion resistant layer 13 may have a thickness of about 200 nm-500 nm.

The compound SiCrN layer has nano-sized silicon crystalline grains, nano-sized chromium crystalline grains, and nitrogen atoms formed therein. The nitrogen atoms are imbedded in the crystal lattices of the silicon and chromium crystalline grains, and form solid solutions in the compound SiCrN layer (a solid solution is an uniform mixture of substances in solid form consisting of two or more types of atoms or molecules that share a crystal lattice). These solid solutions reduce the size of the silicon and chromium crystalline grains, so the corrosion resistant layer 13 becomes tightly packed (i.e, denser). The enhanced compactness will prevent corrosives from entering the corrosion resistant layer 13. Thus, the corrosion resistance property of the coated article 10 is achieved.

Additionally, the corrosion resistant layer 13 has a Si—N phase formed therein, the Si—N phase is highly rigid, which provides the corrosion resistant layer 13 a high rigidity of more than 37 GPa. Thus, the corrosion resistant layer 13 also has a good abrasion resistance property.

Furthermore, comparing to quaternary composition or more than quaternary composition corrosion resistant layers, the corrosion resistant layer 13 in this exemplary embodiment is relatively simple, which makes it easy to produce.

It is to be understood that a chromium transition layer may be formed between the corrosion resistant layer 13 and the substrate 11 to enhance the bond between the corrosion resistant layer 13 and the substrate 11.

A method for making the coated article 10 may include the following steps:

The substrate 11 is pre-treated. The pre-treating process may include the following steps:

The substrate 11 is cleaned in an ultrasonic cleaning device (not shown) filled with ethanol or acetone.

Figure 2:
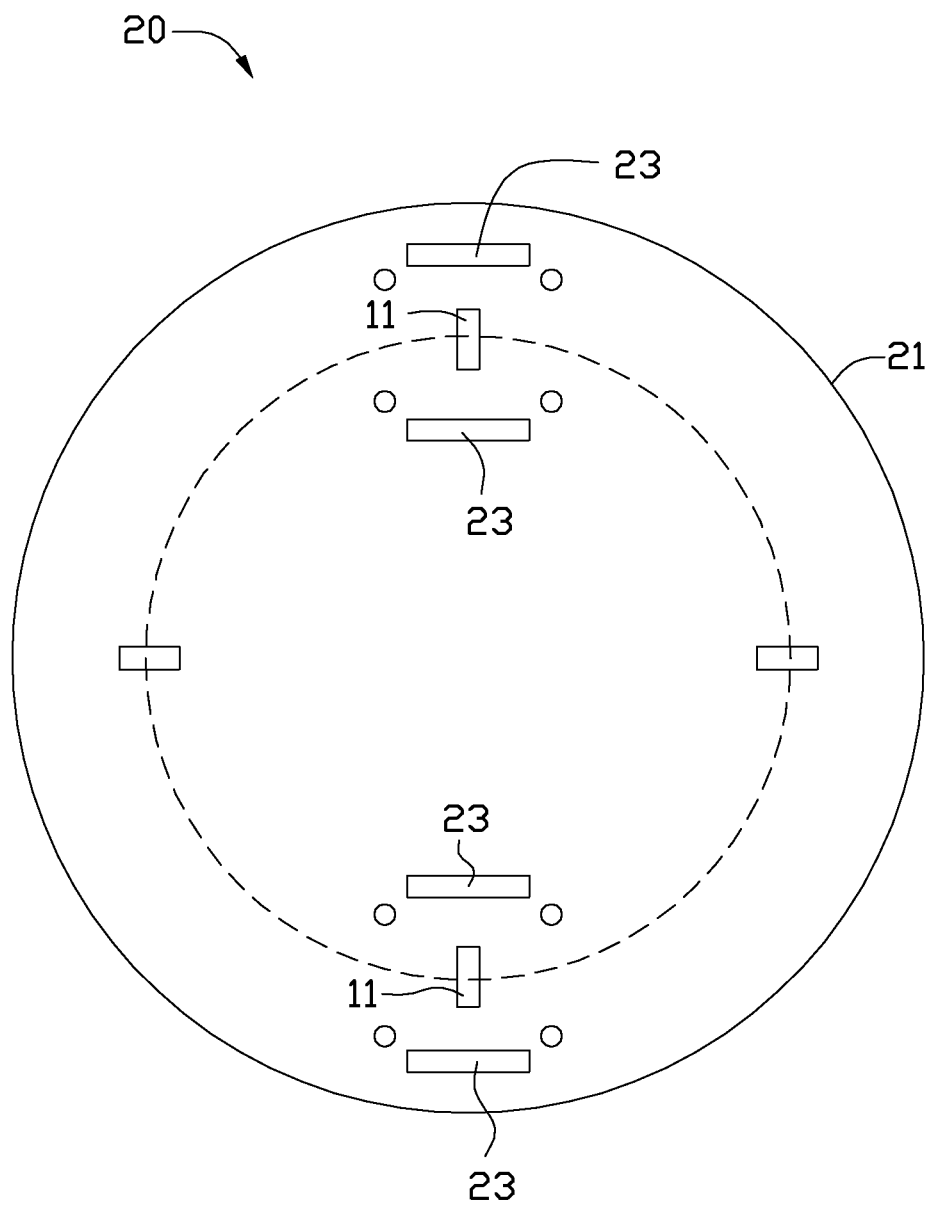
FIG. 2 is an overlook view of an exemplary embodiment of a vacuum sputtering device.

The substrate 11 is plasma cleaned. Referring to FIG. 2, the substrate 11 may be positioned in a coating chamber 21 of a vacuum sputtering device 20. The coating chamber 21 is fixed with compound chromium-silicon targets 23 therein. The coating chamber 21 is then evacuated to about $8.0 \times 10^{-3}$ Pa. Argon gas having a purity of about 99.999% may be used as a working gas and is injected into the coating chamber 21 at a flow rate of about 150 standard-state cubic centimeters per minute (sccm) to about 300 sccm. The substrate 11 may have a negative bias voltage of about −300 V to about −500 V, then high-frequency voltage is produced in the coating chamber 21 and the argon gas is ionized to plasma. The plasma then strikes the surface of the substrate 11 to clean the surface of the substrate 11. Plasma cleaning the substrate 11 may take about 5 minutes (min) to 10 min. The plasma cleaning process enhances the bond between the substrate 11 and the corrosion resistant layer 13. The compound chromium-silicon targets 23 are unaffected by the pre-cleaning process.

The corrosion resistant layer 13 may be magnetron sputtered on the pretreated substrate 11 by using a power at an intermediate frequency for the compound chromium-silicon targets 23. Magnetron sputtering of the corrosion resistant layer 13 is implemented in the coating chamber 21. The internal temperature of the coating chamber 21 may be of about 20° C.-120° C. Nitrogen ($N_2$) may be used as a reaction gas and is injected into the coating chamber 21 at a flow rate of about 60 sccm-80 sccm, and argon gas may be used as a working gas and is injected into the coating chamber 21 at a flow rate of about 150 sccm-200 sccm. The power at an intermediate frequency and at a level of about 5 kilowatt (KW)-7 KW is then applied to the compound chromium-silicon targets 23, then chromium and silicon atoms are sputtered off from the compound chromium-silicon targets 23. The chromium atoms, silicon atoms, and nitrogen atoms are then ionized in an electrical field in the coating chamber 21. The ionized chromium and silicon will chemically react with the ionized nitrogen and deposit the corrosion resistant layer 13 on the substrate 11. During the depositing process, the substrate 11 may have a negative bias voltage of about −150 V to about −500 V. Depositing of the corrosion resistant layer 13 may take about 20 min-40 min.

It is to be understood that before forming the corrosion resistant layer 13, a chromium transition layer may be formed on the substrate 11.

Specific examples of making the coated article 10 are described below. The ultrasonic cleaning in these specific examples may be substantially the same as described above so it is not described here again. Additionally, the process of magnetron sputtering the corrosion resistant layer 13 in the specific examples is substantially the same as described above, and the specific examples mainly emphasize the different process parameters of making the coated article 10.

EXAMPLE 1

Plasma cleaning the substrate 11: the flow rate of Ar is 280 sccm; the substrate 11 has a negative bias voltage of −300 V; plasma cleaning of the substrate 11 takes 9 min.

Sputtering to form corrosion resistant layer 13 on the substrate 11: the flow rate of Ar is 160 sccm, the flow rate of $N_2$ is 65 sccm; the substrate 11 has a negative bias voltage of −200 V; the compound chromium-silicon targets 23 are applied with a power at an intermediate frequency and at a level of 5.5 KW; the internal temperature of the coating chamber 21 is 30° C.; sputtering of the corrosion resistant layer 13 takes 25 min; the corrosion resistant layer 13 has a thickness of 250 nm; the chromium within the corrosion resistant layer 13 has an atomic percentage of about 35%; the silicon within the corrosion resistant layer 13 has an atomic percentage of about 30%; the nitrogen within the corrosion resistant layer 13 has an atomic percentage of about 35%.

EXAMPLE 2

Plasma cleaning the substrate 11: the flow rate of Ar is 230 sccm; the substrate 11 has a negative bias voltage of −480 V; plasma cleaning of the substrate 11 takes 7 min.

Sputtering to form corrosion resistant layer 13 on the substrate 11: the flow rate of Ar is 180 sccm, the flow rate of $N_2$ is 70 sccm; the substrate 11 has a negative bias voltage of −300 V; the compound chromium-silicon targets 23 are applied with a power at an intermediate frequency and at a level of 6 KW; the internal temperature of the coating chamber 21 is 70° C.; sputtering of the corrosion resistant layer 13 takes 30 min; the corrosion resistant layer 13 has a thickness of 370 nm; the chromium within the corrosion resistant layer 13 has an atomic percentage of about 37%; the silicon within the corrosion resistant layer 13 has an atomic percentage of about 33%; the nitrogen within the corrosion resistant layer 13 has an atomic percentage of about 30%.

EXAMPLE 3

Plasma cleaning the substrate 11: the flow rate of Ar is 160 sccm; the substrate 11 has a negative bias voltage of −400 V; plasma cleaning of the substrate 11 takes 6 min.

Sputtering to form corrosion resistant layer 13 on the substrate 11: the flow rate of Ar is 190 sccm, the flow rate of $N_2$ is 75 sccm; the substrate 11 has a negative bias voltage of −450 V; the compound chromium-silicon targets 23 are applied with a power at an intermediate frequency and at a level of 6.5 KW; the internal temperature of the coating chamber 21 is 100° C.; sputtering of the corrosion resistant layer 13 takes 38 min; the corrosion resistant layer 13 has a thickness of 450 nm; the chromium within the corrosion resistant layer 13 has an atomic percentage of about 44%; the silicon within the corrosion resistant layer 13 has an atomic percentage of about 20%; the nitrogen within the corrosion resistant layer 13 has an atomic percentage of about 36%.

A salt spray test has been performed on the coated articles 10 formed by the examples 1-3. The salt spray test uses a sodium chloride (NaCl) solution having a mass concentration of 5% at a temperature of 35° C. The test indicates that the corrosion resistance property of the coated article 10 is lasts longer than 52 hours, thus, the coated article 10 has a good corrosion resistance property.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
an aluminum or aluminum alloy substrate; and
a corrosion resistant layer formed on the substrate, the corrosion resistant layer being a compound silicon-chromium-nitrogen layer;
wherein the compound silicon-chromium-nitrogen has nano-sized silicon crystalline grains, nano-sized chromium crystalline grains, and nitrogen atoms formed therein, the nitrogen atoms are imbedded in the crystal lattices of the silicon and the chromium crystalline grains and form solid solutions in the compound silicon-chromium-nitrogen layer.

2. The coated article as claimed in claim 1, wherein chromium, silicon, and nitrogen within the silicon-chromium-nitrogen have an atomic percentage of about 35%- 40%, 20%- 40%, and 20%- 40% respectively.

3. The coated article as claimed in claim 1, wherein the corrosion resistant layer has a thickness of about 200 nm-500 nm.

4. The coated article as claimed in claim 1, further comprising a chromium transition layer formed between the substrate and the corrosion resistant layer.

* * * * *